United States Patent [19]
Yoeli et al.

[11] Patent Number: 5,684,412
[45] Date of Patent: Nov. 4, 1997

[54] CELL FORMING PART OF A CUSTOMIZABLE LOGIC ARRAY

[75] Inventors: Uzi Yoeli; Eran Rotem, both of Haifa; Yehuda Yizraeli, Yokneam Elite, all of Israel

[73] Assignee: Chip Express (Israel) Ltd., Haifa, Israel

[21] Appl. No.: 516,990

[22] Filed: Aug. 18, 1995

[51] Int. Cl.$^6$ ........................ H03K 7/38; H03K 19/0175
[52] U.S. Cl. ................................. 326/39; 326/82
[58] Field of Search ................... 326/39, 105, 82

[56] References Cited

U.S. PATENT DOCUMENTS

| | | | |
|---|---|---|---|
| 5,289,021 | 2/1994 | Gamal | 326/39 |
| 5,341,041 | 8/1994 | Gamal | 326/39 |
| 5,391,943 | 2/1995 | Mahant-Shetti et al. | 326/39 |
| 5,430,390 | 7/1995 | Chan et al. | 326/39 |
| 5,436,574 | 7/1995 | Veenstra | 326/39 |
| 5,451,887 | 9/1995 | El-Avat et al. | 326/39 |

OTHER PUBLICATIONS

R.J. Landers, S.s. Mahant–Shetti and C. Lemonds, A Multiplexer–Based Architecture for High Density, Low Power Gate Arrays, IEEE Journal of Solid–State Circuits, vol. 30, No. 4, Apr. 1995, pp. 392–396.

G. Robinson, TI Develops Dense Gate–Array Architecture, Electronic Engineering Times, Sep. 25, 1995, p. 42.

Maxfield, C., Delay effect rule in deep–submicron Ics, Electronic Design, Jun. 1995, pp. 109–102.

*Primary Examiner*—Edward P. Westin
*Assistant Examiner*—Richard Roseen
*Attorney, Agent, or Firm*—Browdy and Neimark

[57] ABSTRACT

A cell forming part of a customizable logic array and including at least first and second different multiplexers, an output of the first multiplexer being connected to an input of the second multiplexer.

13 Claims, 3 Drawing Sheets

CELL FORMING PART OF A CUSTOMIZABLE LOGIC ARRAY

FIELD OF THE INVENTION

The present invention relates to application-specific integrated circuits generally and more particularly to the structure of principal building blocks of gate arrays.

BACKGROUND OF THE INVENTION

Microelectronic integrated circuits can be divided roughly into two categories: off-the-shelf devices and custom devices. Custom devices may be divided into three categories: full-custom, standard cell and gate arrays. Gate arrays are simpler to design and manufacture than the other two categories. They usually include only one type of building block. Only the metal interconnect layers have to be customized for each application. The basic building block, also referred to below as a unit logic cell, is commonly composed of four transistors.

Recently relatively complex unit logic cells have been proposed for use in gate arrays. Such unit logic cells are described, for example, in R. J. Landers, S. S. Mahant-Shetti and C. Lemonds, A Multiplexer-Based Architecture for High Density, Low Power Gate Arrays, IEEE Journal of Solid-State Circuits, Vol. 30, No. 4, April 1995, pp 392–396. This article discusses multiplexer based architecture which employs multiplexers.

The relatively complex unit logic cells have the advantage that they enable reduction of the area necessary to implement a given design and the resulting power dissipation.

U.S. Pat. Nos. 5,341,041 and 5,391,943 both describe making up a customizable logic array from base cells each of which includes multiple transistors of differing sizes.

SUMMARY OF THE INVENTION

The present invention seeks to provide an improved customizable logic array and a cell useful therein.

There is thus provided in accordance with a preferred embodiment of the present invention a cell forming part of a customizable logic array and comprising:

at least first and second different multiplexers, an output of the at least first multiplexer being connected to an input of the at least second multiplexer.

There is also provided in accordance with a preferred embodiment of the present invention a customizable logic array comprising a plurality of cells, each comprising:

at least first and second different multiplexers, an output of the at least first multiplexer being connected to an input of the at least second multiplexer.

There is additionally provided in accordance with a preferred embodiment of the present invention a cell forming part of a customizable logic array and comprising at least one multiplexer having at least first and second outputs, each of the outputs having a different drive capability.

Preferably, the first and second different multiplexers have different drive capabilities. In accordance with a preferred embodiment of the present invention, the drive capability of the second multiplexer is at least twice the drive capability of the first multiplexer.

Preferably, the at least first and second different multiplexers have different input loads. In accordance with a preferred embodiment of the present invention, the input load of the first multiplexer is no more than half the input load of the second multiplexer.

Preferably, each of the at least one first and second multiplexers is an inverting multiplexer.

In accordance with a preferred embodiment of the present invention, the cell includes a gate layer and a metal layer which are non-customizable.

BRIEF DESCRIPTION OF THE DRAWINGS

The present invention will be understood and appreciated more fully from the following detailed description, taken in conjunction with the drawings in which.

DETAILED DESCRIPTION OF PREFERRED EMBODIMENTS

Figure 1:
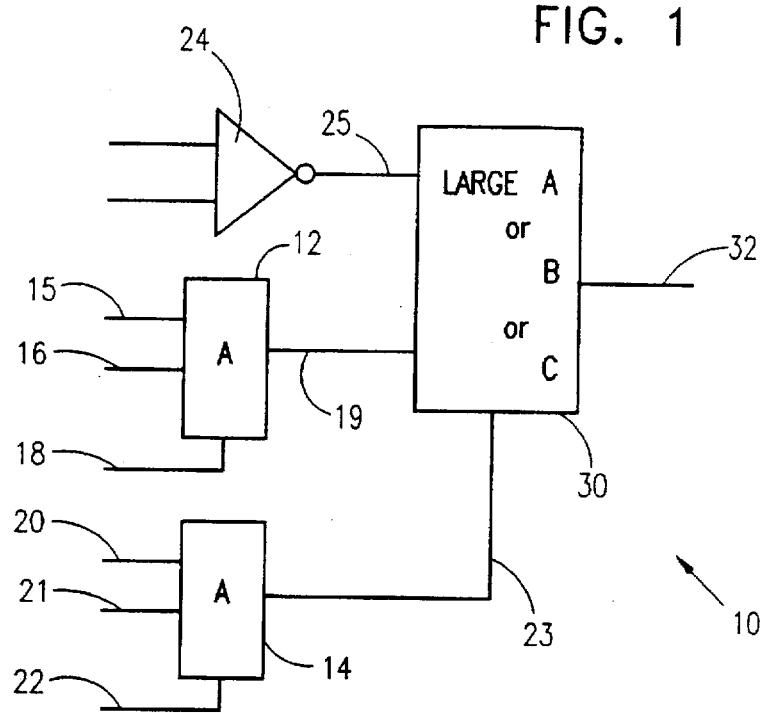
FIG. 1 is a simplified illustration of a base cell constructed and operative in accordance with a preferred embodiment of the present invention.

Reference is now made to FIG. 1, which illustrates a logic cell 10 constructed and operative in accordance with a preferred embodiment of the present invention. The logic cell comprises first and second relatively low drive capability and relatively low input capacitance multiplexers 12 and 14 of the same type, here identified as type A. Multiplexer 12 has signal inputs 15 and 16, a select input 18 and an output 19. Multiplexer 14 has signal inputs 20 and 21, a select input 22 and an output 23. A NAND gate 24 or alternatively any other suitable inverting logic element provides an output 25.

A multiplexer 30 having relatively high drive capability and relatively high input capacitance, as compared with multiplexers 12 and 14, has signal inputs coupled to the outputs 19 and 25 of multiplexer 12 and NAND gate 24 respectively. Multiplexer 30 also receives a select input from the output 23 of multiplexer 14. Multiplexer 30 provides an output 32.

Three different possible embodiments of multiplexer 30 are described hereinbelow with reference to FIGS. 2–4, it being appreciated that further alternative embodiments of the multiplexer 30 may also be employed.

Figure 2:
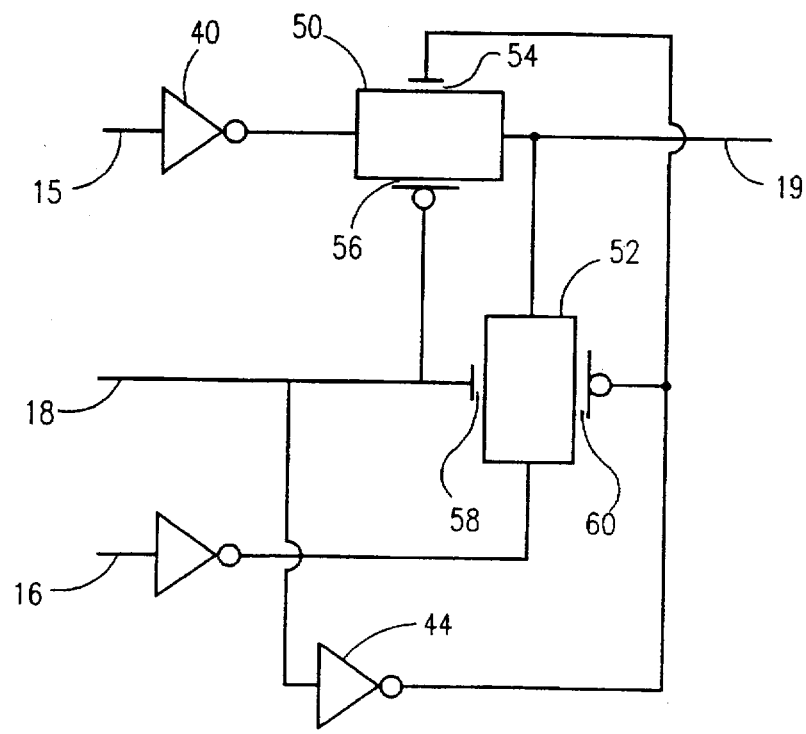
FIG. 2 is a simplified illustration of a multiplexer employed in the base cell of FIG. 1.

Reference is now made to FIG. 2, which illustrates one implementation of multiplexers 12 and 14 of type A (FIG. 1). In this implementation, each of multiplexers 12 and 14 includes three relatively small inverters 40, 42 and 44, each of which receives a signal input, typically inputs 15, 16 and 18 (FIG. 1). Relatively small inverters 40, 42 and 44 are characterized in that they preferably include small transistors, such as an N transistor which is made to be nearly as small as can be practically fabricated in a given process, and a P transistor whose size is determined by the mobility of the N transistor.

Each of multiplexers 12 and 14 of type A includes two transmission gates 50 and 52. Transmission gate 50 comprises an N transistor 54 and a P transistor 56 connected in parallel between the output of inverter 40 and the output 19 of the multiplexer.

Transmission gate 52 comprises an N transistor 58 and a P transistor 60 connected in parallel between the output of inverter 42 and the output 19 of the multiplexer.

The select input 18 of the multiplexer is supplied directly to the gate of the P transistor 56 and to the gate of the N transistor 58. The inverted select input downstream of inverter 44 is supplied to the gate of the P transistor 60 and to the gate of the N transistor 54.

The N and P transistors 54, 56, 58 and 60 are characterized in that they preferably include small transistors, such as an N transistor which is made to be as small as can be practically fabricated in a given process, and a P transistor whose size is determined by the mobility of the N transistor.

The arrangement of FIG. 2 has the following advantageous features:

1. It displays very low input capacitance on inputs 15, 16 and 18.

2. The input capacitances of the various inputs 15, 16 and 18 are independent of each other, since they are connected to gates and not to sources or drains of transistors.

3. The input to output propagation delays of the various inputs 15, 16 and 18 are independent of each other.

The multiplexer of FIG. 2 may also be employed as multiplexer 30, provided that all transistors are made significantly larger, typically three times larger, than those employed in a multiplexer 12 or 14.

The multiplexer embodiment of FIG. 2 is not, however preferred for multiplexer 30. Rather the embodiments of FIG. 3 or FIG. 4 are preferred.

Figure 3:
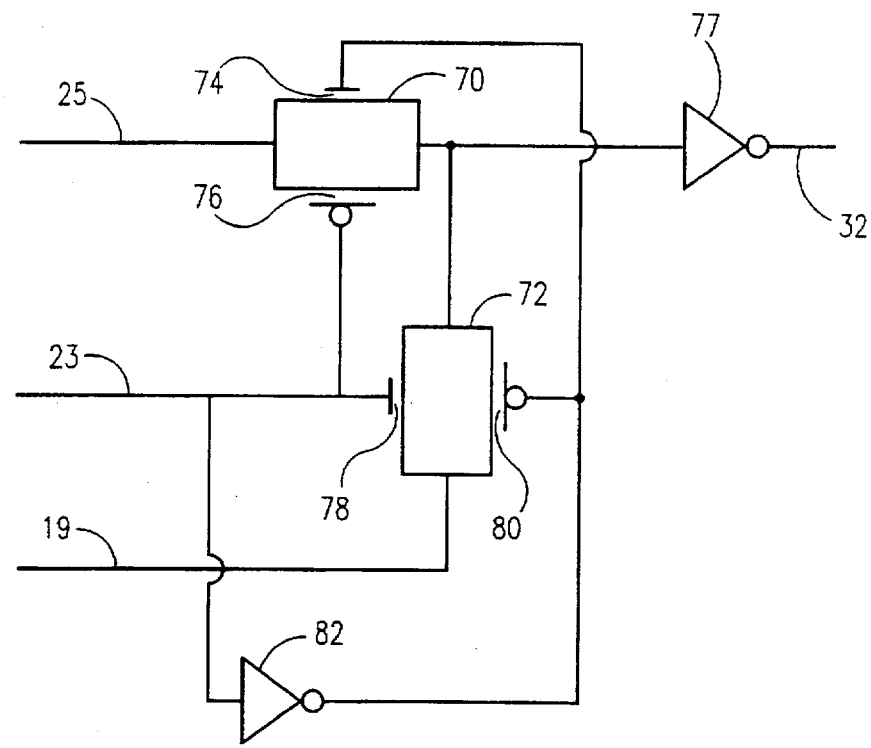
FIG. 3 is a simplified illustration of another multiplexer employed in the base cell of FIG. 1.

Reference is now made to FIG. 3, which illustrates a preferred implementation of multiplexer 30 (FIG. 1). In this implementation, multiplexer 30 includes two transmission gates 70 and 72. Transmission gate 70 comprises an N transistor 74 and a P transistor 76 connected in parallel between output 25 (FIG. 1) and an inverter 77 coupled to the output 32 of the multiplexer 30. Inverter 77 is made of relatively large transistors.

Transmission gate 72 comprises an N transistor 78 and a P transistor 80 connected in parallel between output 19 (FIG. 1) and inverter 77 coupled to the output 32 of the multiplexer 30.

The select input 23 of the multiplexer is supplied directly to the gate of the P transistor 76 and to the gate of the N transistor 78. An inverted select input downstream of an inverter 82 is supplied to the gate of the P transistor 80 and to the gate of the N transistor 74.

The arrangement of FIG. 3 has the following advantageous features:

1. It displays relatively high drive capability, especially when operating with low supply voltage.

2. The input to output propagation delay is relatively small.

Figure 4:
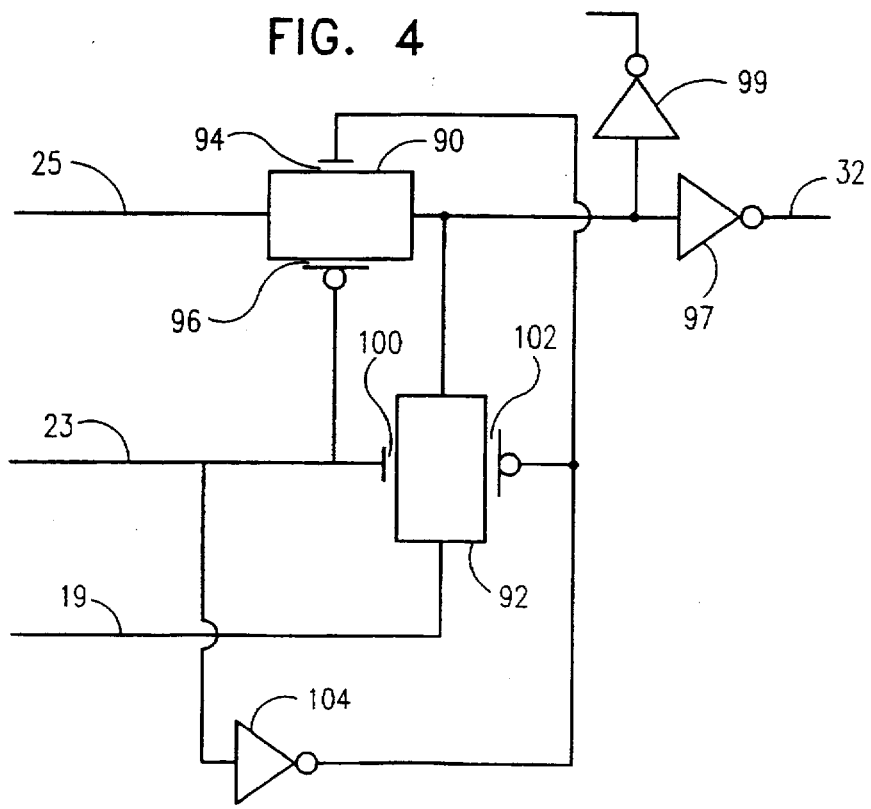
FIG. 4 is a simplified illustration of yet another multiplexer employed in the base cell of FIG. 1 and having two outputs.

Reference is now made to FIG. 4, which illustrates another preferred implementation of multiplexer 30 (FIG. 1). In this implementation, multiplexer 30 includes two transmission gates 90 and 92. Transmission gate 90 comprises an N transistor 94 and a P transistor 96 connected in parallel between output 25 (FIG. 1) and an inverter 97 coupled to the output 32 of the multiplexer 30. A feedback inverter 99 receives the same input as inverter 97 and supplies an inverted feedback output to any suitable one of the signal inputs in the cell of FIG. 1.

Inverter 99 is characterized in that it preferably includes small transistors, such as an N transistor which is made to be nearly as small as can be practically fabricated in a given process, and a P transistor whose size is determined by the mobility of the N transistor.

Transmission gate 92 comprises an N transistor 100 and a P transistor 102 connected in parallel between output 19 (FIG. 1) and inverters 97 and 99.

The select input 23 of the multiplexer is supplied directly to the gate of the P transistor 96 and to the gate of the N transistor 100. An inverted select input downstream of an inverter 104 is supplied to the gate of the P transistor 102 and to the gate of the N transistor 94.

The arrangement of FIG. 4 has the following advantageous feature in addition to those mentioned above in connection with FIG. 3:

It provides a feedback signal required to implement latches and Flip-Flops. The timing of this feedback signal is independent of the load on the output 32 of the cell 10.

The advantages of the cell of FIG. 1 employing the multiplexers 12 and 14 according to the embodiment of FIG. 2 and the multiplexer 30 according to the embodiment of either FIG. 3 or FIG. 4 include the following:

1. It displays very low input capacitance on its signal inputs.

2. The input capacitances of the various inputs are independent of each other, since they are connected to gates and not to sources or drains of transistors.

3. The input to output propagation delays of the various inputs are independent of each other.

4. It displays relatively high drive capability especially when operating with low supply voltage.

5. The input to output propagation delay is relatively small.

6. In the case of FIG. 4, there is provided a feedback signal required to implement latches and Flip-Flops.

7. The effects of disadvantages of individual ones of the various multiplexers are reduced or eliminated by the structure shown in FIG. 1.

Figure 5:
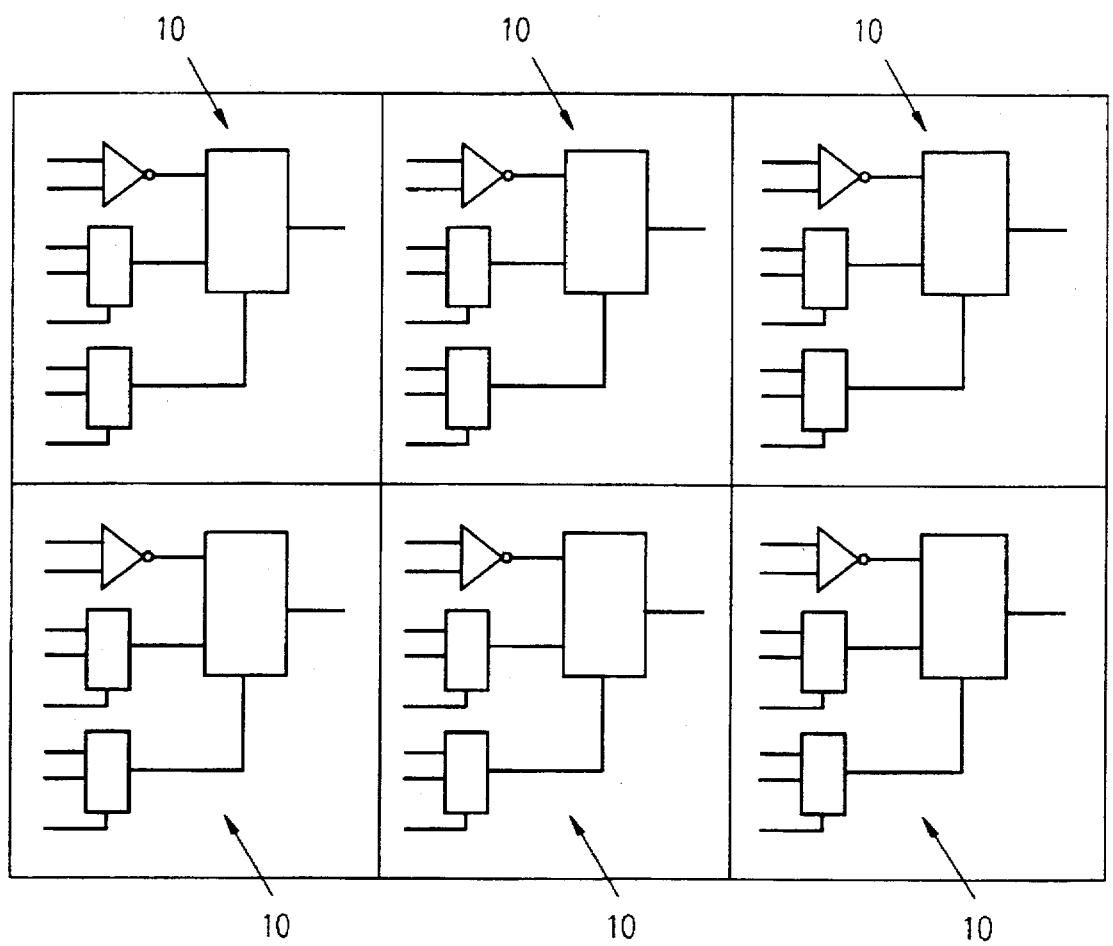
FIG. 5 is a simplified illustration of part of a customizable logic array comprising cells of the type illustrated in FIGS. 1–4.

A part of a customizable logic array based on the cell 10, is shown in FIG. 5. In this figure, as well as in the remaining figures the various inputs and outputs of the components of cells 10 are interconnected to a metal interconnect grid (not shown).

It is a particular feature of the logic array of FIG. 5 that the cells 10 are implemented in polysilicon and a non customizable metal I layer. The customization of the customizable logic array is carried out on interconnect layers disposed above the metal I layer.

It will be appreciated by persons skilled in the art that the present invention is not limited by what has been particularly shown and described hereinabove. Rather the scope of the present invention is defined only by the claims which follow:

We claim:

1. A cell forming part of a customizable logic array and comprising
    at least first and second different multiplexers, an output of said at least first multiplexer being connected to an input of said at least second multiplexer wherein said at least first and second different multiplexers have different drive capabilities.

2. A cell according to claim 1 and wherein the drive capability of said at least second multiplexer is at least twice the drive capability of said at least first multiplexer.

3. A cell according to claim 1 and wherein each of said at least first and second multiplexers is an inverting multiplexer.

4. A cell according to claim 1 and including a gate layer and a metal layer which are non-customizable.

5. A customizable logic array comprising plurality of cells each comprising at least first and second different multiplexers an output of said at least first multiplexer being connected to an input of said at least second multiplexer wherein said at least first and second different multiplexers have different drive capabilities.

6. A customizable logic array according to claim 5 and wherein the drive capability of said at least second multiplexer is at least twice the drive capability of said at least first multiplexer.

7. A customizable logic array according to claim 5 and wherein each of said at least first and second multiplexers is an inverting multiplexer.

8. A customizable logic array according to claim 5 and including a gate layer and a metal layer which are non-customizable.

9. A cell forming part of a customizable logic array and comprising at least one multiplexer having at least first and second outputs, each of the outputs having a different drive capability.

10. A cell according to claim 9 and wherein the drive capability of said at least second output is at least twice the drive capability of said at least first output.

11. A cell according to claim 9 and wherein said at first and second outputs comprise a first output which has five times the drive capability of a second output.

12. A cell forming part of a customizable logic array and comprising:

at least first and second different multiplexers each having at least one input and at least one output, the output of said at least first multiplexer being connected to the input of said at least second multiplexer and wherein said second multiplexer's at least one output includes a first output and a second output having a higher drive capability than said first output, and wherein said first output is selectably customized to provide a feedback signal to at least one input of said at least first multiplexer.

13. A cell forming part of a customizable logic array comprising:

at least first and second different multiplexers, an output of said at least first multiplexer being connected to an input of said at least second multiplexer wherein said second multiplexer has at least first and second outputs, said first output having a lower drive capability than said second output, and wherein said first output can be selectably customized to provide a feedback signal to an input of said at least first multiplexer.

* * * * *